United States Patent [19]
Mitsui et al.

[11] Patent Number: 5,942,356
[45] Date of Patent: Aug. 24, 1999

[54] PHASE SHIFT MASK AND PHASE SHIFT MASK BLANK

[75] Inventors: Masaru Mitsui, Mukawa-mura; Kimihiro Okada, Kofu; Hideki Suda, Hachioji, all of Japan

[73] Assignee: Hoya Corporation, Japan

[21] Appl. No.: 08/825,068

[22] Filed: Mar. 27, 1997

[30] Foreign Application Priority Data

Mar. 30, 1996 [JP] Japan .................................. 8-104411
Sep. 17, 1996 [JP] Japan .................................. 8-266658

[51] Int. Cl.$^6$ ...................................................... G03F 9/00
[52] U.S. Cl. .............................................. 430/5; 428/432
[58] Field of Search .......................... 430/5, 322, 311; 428/432; 204/192.11, 192.12

[56] References Cited

U.S. PATENT DOCUMENTS 5,804,337  9/1998  Mitsui et al. .

*Primary Examiner*—S. Rosasco
*Attorney, Agent, or Firm*—Edward D. Manzo; Mark J. Murphy

[57] ABSTRACT

A half tone type phase shift mask as well as a phase shift mask blank for the mask is formed with a thin film light translucent portion made of essentially, nitrogen, metal, and silicon. The containing rate of each element and ratio in the thin film is specified in a certain range to improve film characteristics, such as acid resistance, photo resistance, conductivity, refractive index rate (film thickness), light transmission rate, etching selectivity, etc. of the light translucent portion. The phase shift mask satisfies optical characteristics (i.e., light transmitting rate and phase shift amount) with high precision, as well as reduces defects in the thin film.

32 Claims, 10 Drawing Sheets

LIGHT AMPLITUDE PROFILE OF MASK

LIGHT INTENSITY PROFILE ON A BODY

FIG. 5

| | COMPOSITION (ATOMIC %) | | | TRANSMISSION RATE (%) | FILM THICKNESS (Å) | REFRACTIVE INDEX RATE |
|---|---|---|---|---|---|---|
| | Mo | Si | O | N | | | |
| EMBODIMENT NO. 1 | 13 | 40 | 0 | 47 | 5 | 931 | 2.34 |
| COMPARATIVE EXAMPLE NO. 1 | 16 | 27 | 40 | 17 | 2 | 1378 | 1.90 |

FIG. 7

| | COMPOSITION (ATOMIC %) | | | | COMPOSITION RATIO | TRANSMISSION RATE (%) | FILM THICKNESS (Å) | REFRACTIVE INDEX RATE | ACID RESISTANCE | CONDUCTIVITY (kΩ/□) |
|---|---|---|---|---|---|---|---|---|---|---|
| | O | N | Si | Mo | Mo : Si | | | | | |
| EMBODIMENT NO. 2 | 0 | 48 | 34 | 18 | 1 : 1.88 | 2 | 855 | 2.45 | △ | 200 |
| EMBODIMENT NO. 3 | 0 | 47 | 40 | 13 | 1 : 3.07 | 5 | 925 | 2.34 | ○ | 600 |
| EMBODIMENT NO. 4 | 0 | 47 | 45 | 8 | 1 : 5.62 | 7 | 969 | 2.28 | ○ | 1500 |
| COMPARATIVE EXAMPLE NO. 2 | 58 | 15 | 17 | 10 | 1 : 1.70 | 5 | 1278 | 1.97 | × | 8000 |

FIG. 8

| | COMPOSITION (ATOMIC %) | | | | COMPOSITION RATIO Mo : Si | | TRANSMISSION RATE (%) | FILM THICKNESS (Å) | REFRAC-TIVE INDEX RATE | ACID RESIS-TANCE | CONDUC-TIVITY (kΩ/□) |
|---|---|---|---|---|---|---|---|---|---|---|---|
| | O | N | Si | Mo | Mo | Si | | | | | |
| EMBODIMENT NO. 5 | 0 | 41 | 44 | 15 | 1 | 2.93 | 4 | 1106 | 2.65 | ○ | 12 |
| EMBODIMENT NO. 6 | 0 | 42 | 43 | 15 | 1 | 2.86 | 6 | 1141 | 2.60 | ○ | 44 |
| EMBODIMENT NO. 7 | 0 | 44 | 42 | 14 | 1 | 3.00 | 8 | 1177 | 2.55 | ○ | 150 |
| COMPARATIVE EXAMPLE NO. 3 | 31 | 16 | 31 | 22 | 1 | 1.41 | 4 | 1495 | 2.22 | ○ | 50 |
| COMPARATIVE EXAMPLE NO. 4 | 33 | 17 | 30 | 20 | 1 | 1.50 | 6 | 1600 | 2.14 | ○ | 200 |
| COMPARATIVE EXAMPLE NO. 5 | 35 | 20 | 28 | 17 | 1 | 1.65 | 8 | 1705 | 2.07 | △ | 400 |

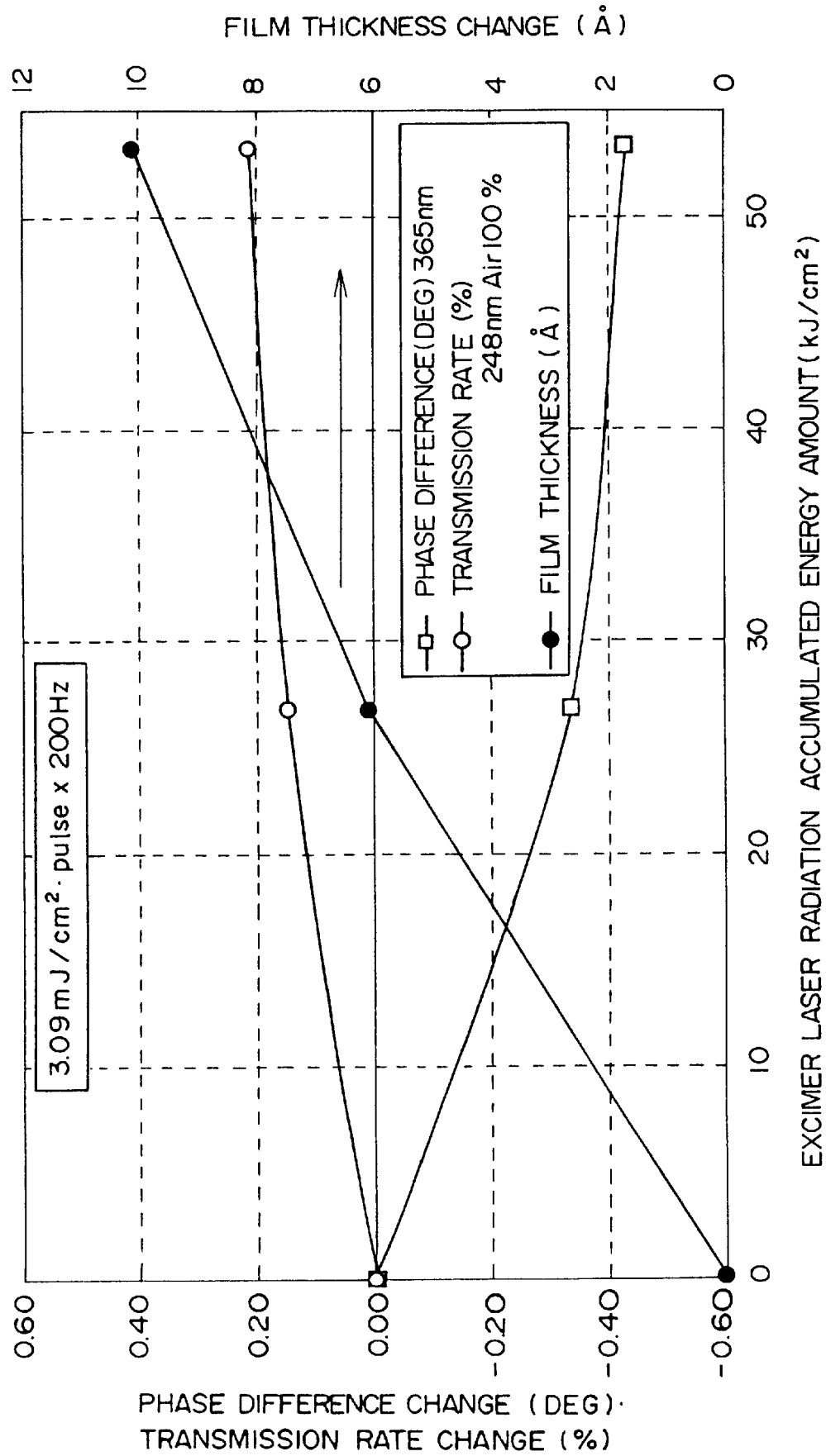

PHASE SHIFT MASK AND PHASE SHIFT MASK BLANK

BACKGROUND OF INVENTION

1) Field of Invention

The invention relates to (1) a phase shift mask capable of transferring patterns with an improved resolution upon placing phase differentials between exposure light rays that pass through the mask, (2) a phase shift mask blank as a material for the phase shift mask, and (3) a manufacturing method for the phase shift mask. More particularly, the present invention is directed to a half tone type phase shift mask, and blank and manufacturing method for the mask.

2) Related Arts

It has been recently determined that the mere increase of the numerical aperture of an exposure apparatus' lens or the mere reduction of wavelength of an exposure apparatus' beam cannot improve practical resolution for lithography, since two key factors, rendition of higher resolution and assurance of depth of focus, required for lithography are in a trade-off relationship.

As a result, phase shift lithography is getting attention as the next generation of lithography. Phase shift lithography is a method to improve photo lithography's resolution by changing only masks without changing any optical system. It can grossly improve the resolution in using interference between transmission light rays upon placing phase differentials between exposure light rays that pass through the photo masks. Such a phase shift mask is a mask in common possession of light intensity information and phase information. It is categorized in several types such as, so-called Levenson, auxiliary pattern, self-alignment (edge enhancement), or the like. These phase shift masks have a more complicated structure than those of conventional photo masks which possess only light intensity information, and require a higher level of technology with regard to manufacturing.

As one of such phase shift masks, a phase shift mask referred as to a half tone type phase shift mask has been developed these days. In such a half tone phase shift mask, the light translucent portion (photo semi-transmission portion) produces a light shield function in which the exposure light is substantially shielded and a phase shift function in which the phase of the light is shifted (ordinarily reversed). Therefore, the half tone phase shift mask, without the necessity to separately form a light-shield film pattern and a phase shift film pattern, has a feature enabling the structure of the mask to be made simple and the manufacturing process of the mask easier.

A typical conventional half tone type phase shift mask is shown in FIG. 1. The half tone type phase shift mask has on a transparent substrate 1 a mask pattern, which is as shown in FIG. 1(a) composed of a light transmitting portion (a photo transmission portion, the exposure areas of the transparent substrate) 2 through which light with intensity capable of substantially contributing to the exposure process passes, and a light translucent portion (light shield and phase shift portion) 3 through which light with intensity unable to substantially contribute to the exposure process passes. The phase of light passing through the light translucent portion is shifted, and the phase of the light that has passed through the light translucent portion thereby has a substantially reverse relationship with the phase of light that has passed through the light transmitting portion (see FIG. 1(b)). Lights passing through boundaries or their vicinity between the light translucent portion and the light transmitting portion diffracts so as to encroach one another due to a diffraction phenomenon and cancel out one another. The light thereby improves the contrast at the boundaries, or the resolution, while the light intensity around the boundaries is nearly nullified.

Meanwhile, the light translucent portion of the half tone type phase shift mask described above must have the optimum values for the transmittancy or transmission rate and the phase shift amount. It has been known that such optimum values in a phase shift mask can be realized by a single layer of the light transmitting portion. Such a phase shift mask has a light transmitting portion made of a thin film of, as a material or essentially all of a material, metals such as molybdenum, silicon, and oxygen, in particular molybdenum silicides, or more specifically, oxides of molybdenum silicon ("MoSiO system material"), or nitride oxides of molybdenum silicon ("MoSiON system material"). With these materials, transmittancy can be controlled by selecting the amount of the oxygen or the nitrogen and oxygen, while the thickness of the thin film can control the phase shift amount. When formed of these materials, the light transmitting portion can be structured as a single layer film made of a single kind material, thereby simplifying the film formation process, in comparison to a case where it is made of multilayer film made of multiple materials. The manufacturing process is simplified since a single etchant can be used.

However, the molybdenum silicide film or the molybdenum silicide nitride oxide film, as elements composing the light translucent portion of the phase shift mask is weak against acid, such as sulfuric acid, used for a primer or rinse fluid for rinsing during mask manufacturing or when masks are used. In particular, where the transmission rate and phase shift amount of the light translucent portion is set for a KrF excimer laser beam (248 nanometers), the attenuation constant (K) must be small, and to realize a small attenuation constant, the degree of oxidation or nitriding oxidation has to be increased sufficiently. If the oxidation degree is so increased, acid resistance of the light translucent portion is significantly lowered, thereby raising a problem that the transmission rate and phase shift amount thus set may have deviated.

When a film for phase shift mask blanks is formed, oxide tends to deposit on target surfaces, especially on non-erosion areas as the degree of oxidation or nitriding oxidation increases, and makes electrical discharge of the film unstable. Consequently, the transmission rate and phase shift amount is poorly controlled, thereby raising a problem that the blanks are formed with defects. Moreover, since the relationship between the composition of the film and film characteristics such as acid resistance, photo resistance, conductivity, deflection rate (thickness), transmission rate, selectivity of etching, etc. remains unsolved, the optimum film characteristics cannot be obtained in light of the manufacturing process or the like even if the required optimum values for both the transmission rate and the phase shift amount are obtained at the stage of blanks. Therefore those values deviate from the designed or set values through experiencing the manufacturing process, resulting in inability to form the optimum phase shift masks.

SUMMARY OF THE INVENTION

It is an object of the present invention to provide a phase shift mask having a light translucent portion of good film characteristics such as acid resistance, photo resistance (durability against light (UV irradiation)), conductivity, deflection rate (thickness), transmission rate, phase shift amount, selectivity of etching, etc. and a blank for the phase shift mask.

It is another object of the present invention to provide a manufacturing method for the blank for the phase shift mask with a light translucent portion of excellent film characteristics.

In one embodiment of the present invention, a phase shift mask for exposure of a very fine pattern, has a transparent substrate and a mask pattern formed on the transparent substrate. The mask pattern has a light transmitting portion transmitting light having intensity substantially contributing to the exposure and a light translucent portion transmitting light having intensity substantially not contributing to the exposure. The light translucent portion shifts a phase of the light having passed through the light translucent portion to cancel, by rendering the phase of the light having transmitted through the light translucent portion to be differentiated from a phase of the light having transmitted through the light transmitting portion, the intensity of light transmitted around/through a boundary located between the light translucent portion and the light transmitting portion for an improvement of a contrast at the boundary. The light translucent portion is formed of a thin film made of a material including essentially nitrogen, metal, and silicon, with a containing rate is set at thirty atomic per cent or greater and at sixty atomic per cent or less of silicon.

In another embodiment of the invention, the phase shift mask has a specific range of sheet resistance in lieu of a specific range of containing rate of silicon. In this phase shift mask, a sheet resistance of the substrate on which the thin film is formed is set at one kilo ohm per square (1 K$\Omega$/□) or greater and at one point five mega ohm per square (1.5 M$\Omega$/□) or less.

According to a preferred embodiment of the present invention, the ratio of the metal to the silicon is one to one point five or greater and one to six or less. The containing rate of the nitrogen may be set at thirty atomic percent or greater and at sixty atomic per cent or less, and preferably, the containing rate of the nitrogen is set higher than the containing rate of the silicon. The metal for the phase shift mask of the present invention can be made of, but not limited to, molybdenum.

According to another preferred embodiment of the present invention, a phase shift mask blank is manufactured by preparing a target containing silicon of seventy to ninety mole per cent and metal, and sputtering atoms from the target in an atmosphere including nitrogen to form a phase shift layer including nitrogen, metal, and silicon. Such a phase shift mask blank may be formed with a transparent substrate, and a thin film made of a material essentially including nitrogen, metal, and silicon.

BRIEF DESCRIPTION OF DRAWINGS

The above and other objects and features of the present invention are apparent to those skilled in the art from the following preferred embodiments thereof when considered in conjunction with the accompanied drawings, in which:

FIG. 5 is a diagram showing film composition and film characteristics;

FIGS. 7, 8 are diagrams showing film composition and film characteristics;

FIG. 11 is a diagram showing alkali resistance of the phase shift mask blank according to the present invention.

DETAILED DESCRIPTION OF PREFERRED EMBODIMENTS

Figure 1:
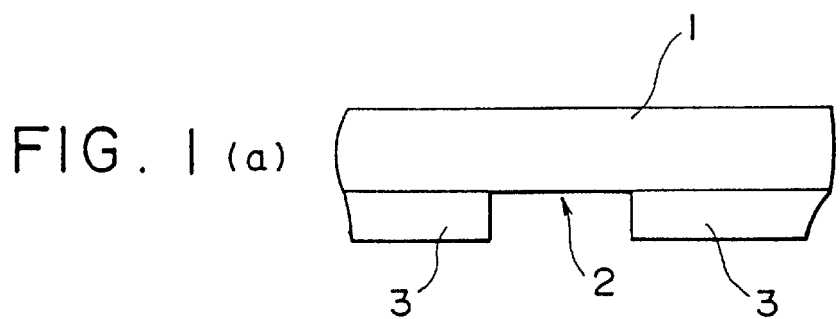
FIG. 1 is a diagram illustrating a transfer mechanism of a conventional half tone type phase shift mask.
Figure 1:
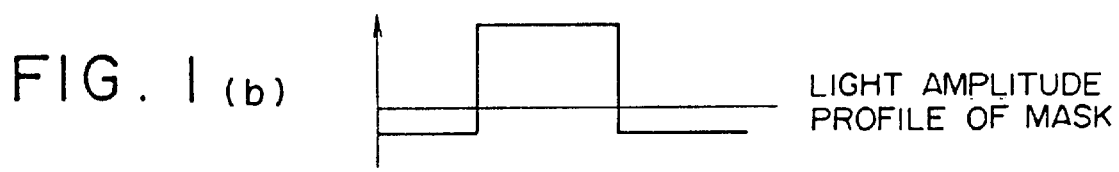
Figure 1:
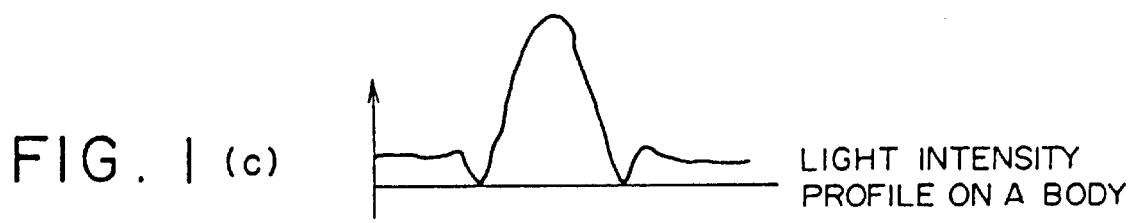

A phase shift mask according to the present invention is described below. The phase shift mask has a light translucent portion, which is formed by a thin film made of a material essentially composed of metal, silicon, and nitrogen. The thin film, though insufficient, has an improved acid resistance and produces stable discharges, in contrast to a thin film containing oxygen, because the light translucent portion is formed of a thin film that does not contain oxygen. Examples of metals to form such a thin film are molybdenum, tantalum, tungsten, titanium, chromium, etc. There is no simple explanation about binding conditions of the material constituting the light translucent portion. This is because it may be improper to describe the material with simplified formulas where, e.g., SiN, MoSiN, MoN, etc. are complexly related in molybdenum silicon nitrides. In addition, there is no simple explanation about rates of compositions because, e.g., composition rates may vary in a depth or thickness direction.

Specific examples of a material, essentially including metal, silicon, and nitrogen, for constituting the photo semi-transmission portion, are molybdenum silicon nitride (referred as to "MoSiN system material"), tantalum silicon nitride (referred as to "TaSiN system material"), tungsten and silicon nitride (referred as to "WSiN system material"), titanium silicon nitride (referred as to "TiSiN system material"), etc. These materials can contain, as compounds or mixtures of those materials, a small or proper amount of carbon, hydrogen, fluorine, helium, etc. so long as it does not affect the functions of the light translucent portion. The material constituting the light translucent portion may be formed of, e.g., nitrides of molybdenum silicide, tantalum silicide, or tungsten silicide, or mixtures of one or more of those nitrides and silicon nitride or/and metal nitride. The material constituting the light translucent portion may also be formed of one or more of conventionally known materials, such as molybdenum silicide nitride (MoSiN), tantalum silicide nitride (TaSiN), tungsten silicide nitride (WSiN), titanium silicide nitride (TiSiN).

The light translucent portion commonly serves a light-shield function in which the exposure light is substantially cut off and a phase shift function in which the phase of light is shifted. Set values for these functions depend on the light source of the exposure when the mask is used and its wavelength. It is required to select or design the set values corresponding to the exposure light source and its wavelength. Example of an exposure light source and its wavelength are mercury lamp I-line(wavelength =365 nanometers), mercury lamp G-line(wavelength=436 nanometers), KrF excimer laser (wavelength=248 nanometers), ArF excimer laser (wavelength=193 nanometers), etc.

A phase shift amount at the light translucent portion is controlled by adjusting the refractive index rate (including the attenuation constant) of the film composition (containing rates of nitrogen, silicon, and metal (atomic per cent)) of the light translucent portion and the film thickness. Assuming that the phase shift amount is φ; the wavelength of the exposure light is λ; and the refractive index rate is n; the thickness d of the light translucent portion can be determined by the following Formula (1).

$$d = (\phi/360) \times [\lambda/(n-1)] \quad (1)$$

The phase shift amount in Formula (1) is preferably 180 degrees in terms of improvements of the resolution, but practically the amount can be 160 to 200 degrees.

The light translucent portion's light transmission rate (light-shield performance) to the exposure light is generally about 2 to 20 per cent, preferably, although it depends on sensitivity of the resist that is used for forming patterns for semiconductor devices. A higher light transmission rate in this range is preferred because the higher transmission rate has higher phase effects. However, in the case of line and space patterns, a lower light transmission rate is preferable, while a higher light transmission rate is preferable in the case of hole system patterns. The light transmission rate of the light translucent portion is controllable by adjusting mainly the containing rates of nitrogen, silicon, and metal (atomic per cent) in the thin film constituting the light translucent portion.

The present invention has the feature that the containing rate (atomic per cent) and ratio of each element in the thin film, made of a material essentially including nitrogen, metal, and silicon, are specified. Although it is an absolute condition required for the light translucent portion, when made of a single layer film, to satisfy at the same time the optimum values for both the light transmission rate and the phase shift amount f, such a condition is not enough. The composition of the thin film constituting the light translucent portion should be determined in consideration of the manufacturing process or the like. For example, it is necessary to have a film composition that is strong against acid attack such as the sulfuric acid used as the primer or rinse fluid for rinsing during the mask manufacturing process or while the mask is in use, and so that set the transmission rate and phase difference will not be deviated due to acid rinsing. To ensure the stability of the film and to prevent the film from charging up during the mask's fabrication, the film composition has to have good conductivity. Specifically, during film formations of the phase shift mask blank, compounds (e.g., oxides) tend to deposit on the surface of the target, especially on non-erosion areas. This renders unstable discharging, impairs controllability of the transmission rate and film thickness, and likely causing defects to the blanks. If the mask blanks have bad conductivity, charging up during mask fabrications causes the scanning to disable or reduces the precision of the scanning, and likely leads to defective masks. It is also necessary to form a film composition having a relatively high refractive index rate capable of making thinner the thickness needed for reversing the phase. This is because making the thickness thinner improves the productivity of the mask and because smaller vertical differences in the mask pattern can reduce pattern destruction during rinsing (or scrub rinsing or the like) due to mechanical friction. Moreover, it is necessary to form a film composition having excellent selectivity of etching to a quartz substrate or the like. This is to minimize an etching amount of the quartz substrate or the like and to avoid changes of the phase shift amount f.

With the phase shift mask according to the present invention, regarding the above concerns, the containing rate (atomic per cent) and ratio of each element in the thin film constituting the light translucent portion is specified. The film composition in a region within a certain depth from the surface, or the surface layer, of the light translucent portion is particularly important because it affects ease of rinsing and conductivity.

According to the phase shift mask, the containing rate of silicon in the thin film, made of a material essentially including nitrogen, metal, and silicon, constituting the light translucent portion is set at 30 to 60 atomic per cent. The containing rate of silicon mainly affects the light transmission rate. If the containing rate of silicon is less than 30 atomic per cent, a high transmission rate becomes difficult to obtain. If the containing rate of silicon exceeds 60 atomic per cent, the etching selectivity to the quartz substrate or the like is lowered. Therefore, the containing rate of silicon is preferably at 40 to 50 atomic per cent.

According to the phase shift mask, the ratio of metal to silicon by atomic per cent in the thin film, made of a material essentially including nitrogen, metal, and silicon, constituting the light translucent portion is preferably at 1 to 1.5 to 6.0. The ratio of metal to silicon mainly affects the acid resistance and the photo resistance. If the ratio of metal to silicon is less than 1 to 1.8, the film lacks good acid resistance. If the ratio exceeds 1 to 6.0, the electric resistance becomes high. Therefore, the preferable ratio of metal to silicon is 1 to 2.0 to 5.0.

According to the phase shift mask, the containing rate of nitrogen in the thin film, made of a material essentially including nitrogen, metal, and silicon, constituting the light translucent portion is preferably set at 30 to 60 atomic per cent. The containing rate of nitrogen, as well as that of silicon, mainly affects the light transmission rate and etching characteristics. If the containing rate of nitrogen is less than 30 atomic per cent, a high transmission rate becomes difficult to obtain. If the containing rate of nitrogen exceeds 60 atomic per cent, the etching rate becomes extremely high, thereby making the CD control difficult.

According to the phase shift mask, it is preferred to set the thin film's conductivity or the sheet resistance of the substrate (or blank) on which the thin film is formed at 1 kilo ohm to 1.5 mega ohm per square, by specifying the containing rate (atomic per cent) and ratio of each element in the thin film, made of the material essentially including nitrogen, metal, and silicon, constituting the light translucent portion. The conductivity (sheet resistance) mainly affects discharge stability of the sputtering target during film formations and preventive performance of charging up during mask fabrications. The sheet resistance is preferably at 1.5 mega ohm per square or less. In particular, it is preferred that the sheet resistance is 1 mega ohm per square or less to obtain the discharge stability during film formations. It is further preferred that the sheet resistance is 0.5 mega ohm per square or less to prevent charging up during mask fabrications. To obtain a thin film of the composition thus described while ensuring the discharge stability during film formations, it is preferred to form a phase shift layer including nitrogen, metal, and silicon by sputtering atoms in an atmosphere inclusive of nitrogen from a target that contains 70 to 95 mol per cent silicon and metal, in order to fabricate the phase shift mask blanks. This is because the process is subject to bad conductivity (or hard to feed voltage) at the target surface (erosion area) during DC sputtering if the containing rate of silicon in the target is greater than 95 mol per cent, and thereby causing discharges unstable.

On the other hand, if the silicon's containing rate is less than 70 mol per cent, a thin film for constituting a high transmission rate light translucent portion cannot be obtained. Such discharge stability during film formations affects film quality, and if films are formed under good discharge stability, the light translucent portion will have good quality.

Figure 2:
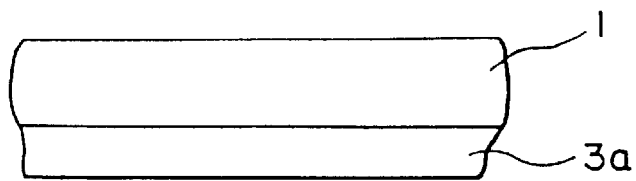
FIG. 2 is a partial cross section showing a half tone type phase shift mask blank.

As shown in FIG. 2, a phase shift mask blank is formed where a light translucent film 3a is formed on a transparent substrate 1. In the phase shift mask and the manufacturing method thus described, the transparent substitute is not limited as far as transparent with respect to the exposure wavelength. As such a transparent substrate, for example, a quartz substrate, a silica substrate, or other glass substrates (e.g., soda lime glass, aluminosilicate glass, aluminoborosilicate glass, etc.) are exemplified. Patterns (patterning and mask treatment process) can be formed by known lithography techniques (coating resist, exposure, development, etching, removal of resist, and rinse) with photo or electron beam, and are not limited.

The following detailed descriptions are based on the inventors' experiments, which indicate the feature of the phase shift mask according to the present invention.

Embodiment No. 1

Fabrication of a blank

A light translucent film made of a molybdenum silicon nitride (MoSiN system material) thin film was formed on a surface of a transparent substrate. This was for a phase shift mask blank for a KrF excimer laser (wavelength 248 nanometers). More specifically, using a mixing target (Mo: Si=20: 80 mol %) of molybdenum (Mo) and silicon (Si), a molybdenum silicon nitride (MoSiN) thin film, whose thickness was 931 angstroms, was formed on the transparent substrate by reactive sputtering in a mixture gas atmosphere (Ar 10%, $N_2$ 90%, pressure $1.5 \times 10^{-3}$ Torr) of Argon (Ar) and nitrogen ($N_2$).

Figure 3:
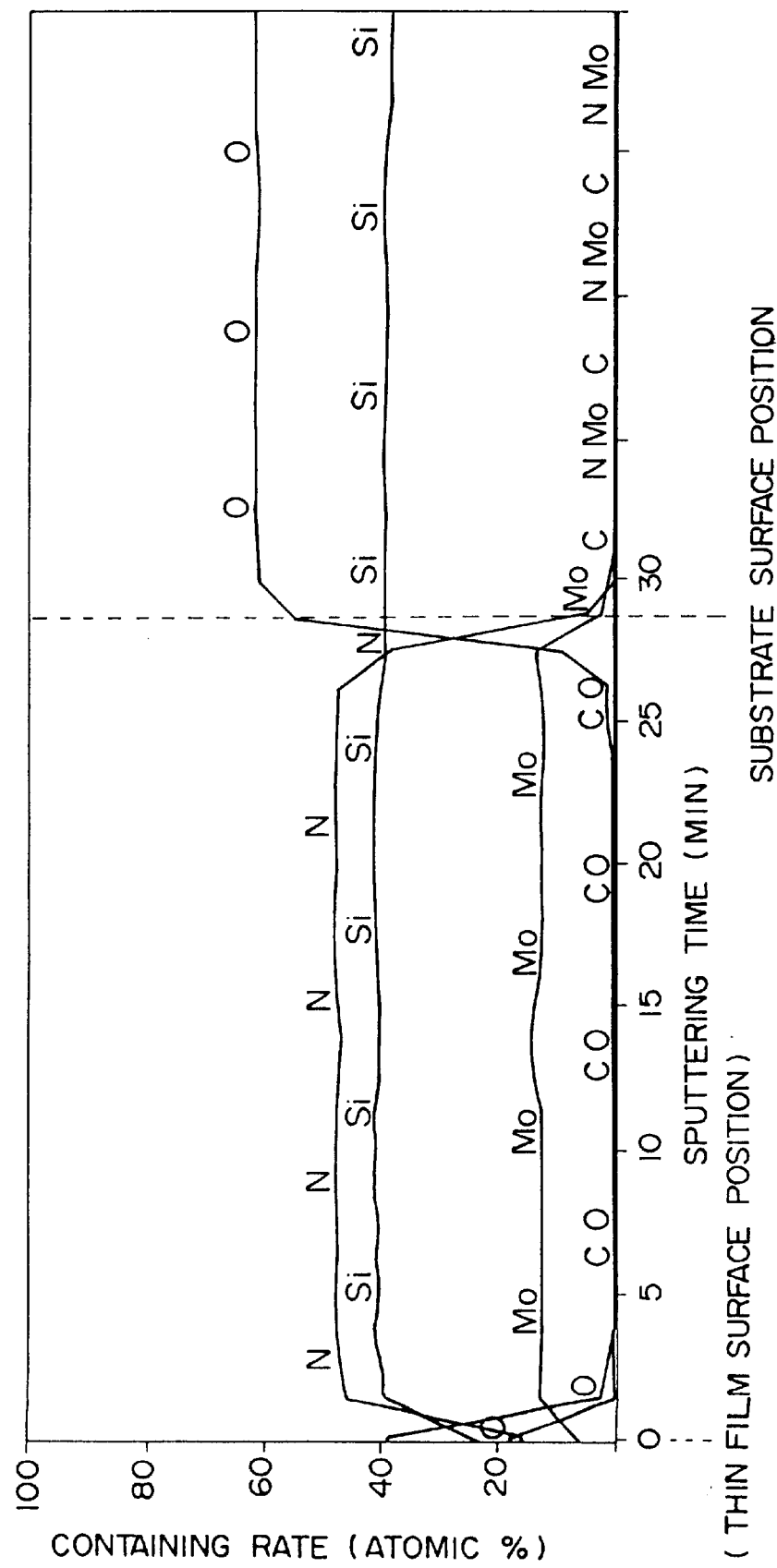
FIG. 3 is a diagram showing ESCA analysis results of a light translucent film in Embodiment No. 1.

FIG. 3 shows the ESCA analysis results of the light translucent film thus obtained. According to FIG. 3, the film composition of the light translucent film (the average of the entire samples) was Mo, 12.5 atomic per cent; Si, 40.2 atomic per cent; N, 47.3 atomic per cent. Based on the ESCA analysis results, oxygen was detected on the sides of the quartz substrate and the surface of the light translucent film. The surface side of the light translucent film was oxidized after the film formation. On the side of the substrate, oxygen of silicon oxide was detected at the boundary. When the film was thus oxidized, the containing rate of nitrogen at portions thus oxidized may be lowered more than the suitable range of 30 to 60 atomic percent. The values described above for the present invention are found in the main portion of the film, excluding the surface portion and the interface portion with the substrate. It is to be noted that in the light translucent film, the essential portion containing no oxygen is about 87.5% of the entire thickness, whereas a portion containing oxygen on the quartz substrate side is about 8.0% of the entire thickness and a portion containing oxygen on the surface side is about 4.5% or less of the entire thickness.

Figure 4:
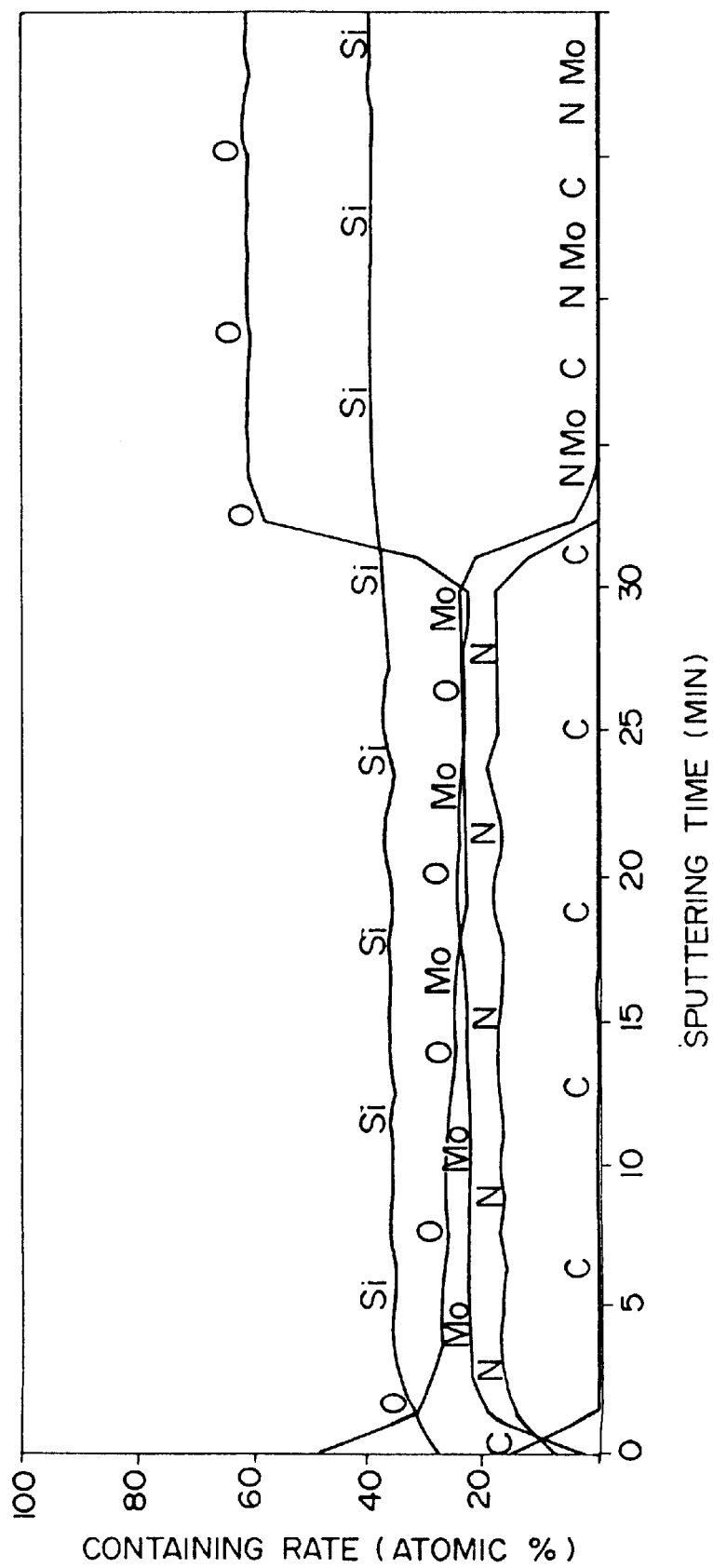
FIG. 4 is a diagram showing ESCA analysis results of a light translucent film (MoSiON)

As a reference, FIG. 4 shows ESCA analysis results of the light translucent film made of molybdenum and silicon nitride oxide (MoSiON). According to the phase shift mask of the present invention, when a thin film of molybdenum silicon nitride is formed, oxygen may be contained at the quartz substrate and surface sides of the light translucent film as described above (though not necessarily be contained). Therefore, for example, the MoSiN film of the essential portion containing no oxygen and the film on the surface side containing oxygen may interact with each other, to some extent. To this extent, the thin film made of molybdenum silicide nitride MoSiN according to the present invention includes a film thus containing oxygen around the surface.

Although the ESCA analysis results did not detect almost any oxygen at the essential portion of the light translucent film, oxygen can be contained as long as not substantially affecting the film quality. Specifically, oxygen ($O_2$) of an amount of 5 atomic per cent or less can be contained in the light translucent film.

Figure 6:
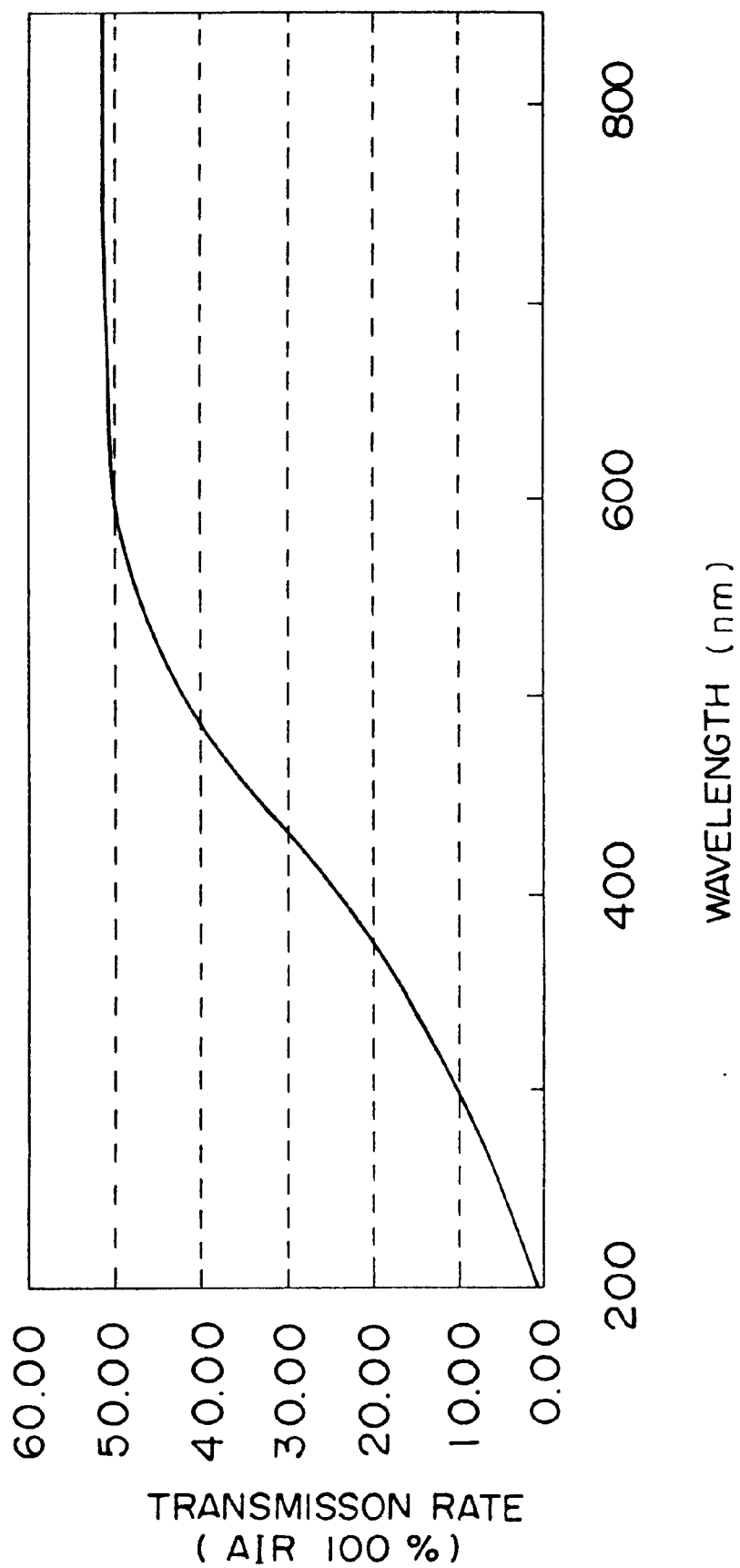
FIG. 6 is a diagram showing wavelength dependency of light transmission rate in Embodiment No. 1.

FIG. 5 shows the film composition (average of the entire films) and film characteristics (transmission rate, film thickness, and refractive index rate at a wavelength of 248 nanometers). FIG. 6 shows a graph indicative of wavelength dependency of the light transmission rate of the phase shift mask blank thus obtained. The light transmission rate of the obtained phase shift mask blank was 5 per cent at a wavelength of 248 nanometers, 19 per cent at a wavelength of 365 nanometers, and 40 per cent at a wavelength of 488 nanometers. The phase shift amount (phase angle) f of the phase shift mask blank was 181 degrees, where the refractive index was 2.34. The light transmission rate was measured with a spectrophotometry instrument (Shimazu Seisakusho K.K. made: UV-2400PC), and the phase angle was measured with a phase differential measurement instrument (Lasertech K.K. made: MPM-248).

COMPARATIVE EXAMPLE NO. 1

Fabrication of blank

A light translucent film made of a molybdenum silicon nitride oxide (MoSiON) thin film was formed on a surface of a transparent substrate. This was for a phase shift mask blank for a KrF excimer laser (wavelength 248 nanometers). More specifically, using a mixing target (Mo: Si=33: 67 mol %) of molybdenum (Mo) and silicon (Si), a molybdenum silicon nitride oxide (MoSiON) thin film, whose thickness was 1378 angstroms, was formed on the transparent substrate by reactive sputtering in a mixture gas atmosphere (Ar 84%, $N_2O$ 16%, pressure $1.5 \times 10^{-3}$ Torr) of Argon (Ar) and suboxide nitrogen ($N_2O$).

FIG. 5 shows film composition (average of the entire film) and film characteristics (transmission rate, film thickness, and refractive index rate at wavelength of 248 nanometers). The phase shift amount (phase angle) f of the obtained phase shift mask blank at a wavelength of 248 nanometers was 180 degrees, when the refractive index was 1.90. As apparent from Embodiment No. 1, Comparative Example No. 1, and FIG. 5, a thinner film thickness can be enough to gain the phase difference of 180 degrees upon forming the thin film of molybdenum silicon nitride (MoSiN) rather than of molybdenum silicon nitride oxide (MoSiON) because the refractive index is greater.

Next, the acid resistance, photo resistance, conductivity, when the film composition and film composition ratio are changed, was explored.

Embodiment No. 2

Fabrication of a blank

A light translucent film made of a molybdenum silicon nitride (MoSiN system material) thin film was formed on a surface of a transparent substrate. This was for a phase shift mask blank for a KrF excimer laser (wavelength 248 nanometers). More specifically, using a mixing target (Mo: Si=30: 70 mol %) of molybdenum (Mo) and silicon (Si), a molybdenum silicon nitride (MoSiN) thin film, whose thickness was 855 angstroms, was formed on the transparent substrate by reactive sputtering in a mixture gas atmosphere (Ar 10%, $N_2$ 90%, pressure $1.5 \times 10^{-3}$ Torr) of Argon (Ar)

and nitrogen ($N_2$). The light transmission rate of the obtained phase shift mask blank at a wavelength of 248 nanometers was 2 percent. The phase shift amount (phase angle) f was about 180 degrees. The light transmission rate was measured with a magnetic spectrophotometer (Hitachi K.K. made, model 340). The angle was measured with a phase differential measurement instrument (Lasertech K.K. made: MPM-248).

FIG. 7 shows film composition (average of the entire films, including the film composition ratio) and film characteristics (transmission rate, film thickness, and refractive index rate, acid resistance, and conductivity). Regarding the acid resistance, a circle represents no change; a triangle represents small changes within a permissive range; and a cross represents great changes out of the permissive range, when the samples were dipped in hot concentrated sulfuric acid at 120 Celsius degrees for two hours.

Mask Fabrication

A resist film was formed on a thin film made of molybdenum silicon nitride (MoSiN) for the phase shift mask blank, and then a resist pattern was formed by selective exposure and development. The exposed portions of the thin film made of molybdenum silicon nitride (MoSiN) were then removed by etching (dry etching with $CF_4+O_2$ gases) to obtain a thin film pattern (holes and dots) made of molybdenum silicon nitride. After removal of the resist, the film was dipped in 98% sulfuric acid ($H_2SO_4$), at 100 Celsius degrees for fifteen minutes and then rinsed with sulfuric acid. Phase shift masks for KrF excimer laser were obtained after being rinsed with pure water or the like.

Embodiment No. 3

A phase shift mask blank and a phase shift mask were obtained in the same manner as Embodiment No. 2, except that when using a mixing target in which the ratio of molybdenum to silicon was changed (Mo: Si=20: 80 mol %), a molybdenum silicon nitride (MoSiN) thin film was formed (with the thickness 925 angstroms) on a transparent substrate. FIG. 7 shows the film composition and film characteristics.

Embodiment No. 4

A phase shift mask blank and a phase shift mask were obtained in the same manner as Embodiment No. 2, except that when using a mixing target in which the ratio of molybdenum to silicon was changed (Mo: Si=10: 90 mol %), a molybdenum silicon nitride (MoSiN) thin film was formed (with the thickness 969 angstroms) on a transparent substrate. FIG. 7 shows the film composition and film characteristics.

COMPARATIVE EXAMPLE NO. 2

Fabrication of a blank

A light translucent film made of a molybdenum silicon nitride oxide (MoSiON) thin film was formed on a surface of a transparent substrate. This was for a phase shift mask blank for a KrF excimer laser (wavelength 248 nanometers). More specifically, a phase shift mask blank and a phase shift mask were obtained in the same manner as Embodiment No. 2, except that when using a mixing target (Mo: Si=33: 67 mol %) of molybdenum (Mo) and silicon (Si), a molybdenum silicon nitride oxide (MoSiON) thin film, whose thickness was 1278 angstroms, was formed on the transparent substrate by reactive sputtering in a mixture gas atmosphere (Ar 76%, $N_2O$ 24%, pressure $1.5 \times 10^{-3}$ Torr) of Argon (Ar) and suboxide nitrogen ($N_2O$). FIG. 7 shows the film composition and film characteristics.

Embodiments 5 to 7

Fabrication of blank

A light translucent film made of a molybdenum silicon nitride (MoSiN) thin film was formed on a surface of a transparent substrate; this was for a phase shift mask blank for I-line (wavelength 365 nanometers). More specifically, a phase shift mask blank and a phase shift mask were obtained in the same manner as Embodiment No. 2 except that using a mixing target (Mo: Si=20: 80 mol %) of molybdenum (Mo) and silicon (Si), a molybdenum silicon nitride (MoSiN) thin film, whose thickness was 1106 to 1177 angstroms, was formed on the transparent substrate by reactive sputtering in a mixture gas atmosphere (Ar 62 to 52%, $N_2$ 38 to 48%, pressure $1.5 \times 10^{-3}$ Torr) of Argon (Ar) and nitrogen ($N_2$). FIG. 8 shows the film composition and film characteristics. The light transmission rate was measured using a magnetic spectrophotometer (Hitachi K.K. made, model 340); the phase angle was measured using a phase differential measurement instrument (Lasertech K.K. made: MPM-100).

COMPARATIVE EXAMPLES 3 to 5

Fabrication of a blank

A light translucent film made of a molybdenum silicon nitride oxide (MoSiON) thin film was formed on a surface of a transparent substrate. This was for a phase shift mask blank for I-line (wavelength 365 nanometers). More specifically, a phase shift mask blank and a phase shift mask were obtained in the same manner as Embodiments No. 5 to 7, except that when using a mixing target (Mo: Si=33: 67 mol %) of molybdenum (Mo) and silicon (Si), a molybdenum silicon nitride oxide (MoSiON) thin film was formed on the transparent substrate by reactive sputtering in a mixture gas atmosphere [(Comparative Example No. 3, Ar 86%, $N_2O$ 14%, pressure $1.5 \times 10^{-6}$ Torr), (Comparative Example No. 4, Ar 85%, $N_2O$ 14%, pressure $1.5 \times 10^{-6}$ Torr), (Comparative Example No. 5, Ar 83%, $N_2O$ 17%, pressure $1.5 \times 10^{-6}$ Torr) of Argon (Ar) and nitrogen ($N_2$). FIG. 8 shows the film composition and film characteristics.

Evaluation

Film composition and film characteristics

As apparent from FIG. 7, where less silicon exists in the film, the transmission rate becomes worse and the acid resistance is impaired. In contrast, where greater silicon is in the film, the transmission rate and the acid resistance will be improved. Therefore, the silicon containing rate in the film is preferably 30% or more, and more preferably 40% or more in consideration of the acid resistance. It was also discovered that if the film contains too much silicon, the electrical resistance becomes higher. Therefore, it is preferred that the silicon containing rate (atomic per cent) in the film is 60% or less. As apparent from FIGS. 7, 8, the refractive index rate and film thickness are controllable by adjusting the composition in the film. According to the phase shift mask, since the refractive index rate can be made relatively high, and the film thickness can be made extremely thin to reverse the phase, the phase shift mask can improve its productivity, as a matter of course. Since height differences of the mask pattern can be made smaller, the mask can reduce pattern destruction during rinsing due to mechanical friction or the like. Since the etching speed can be made very fast, the quartz substrate or the like can be selectively etched well.

Conductivity

As apparent from FIGS. 7. 8, the conductivity (sheet resistance) is controllable by adjusting the composition in the film. The sheet resistance is preferably 1500 kilo ohm per square, and more preferably 1000 kilo ohm per square to secure the discharge stability during film formations, and still further preferably 500 kilo ohm per square to prevent charging up during mask fabrications. As shown in FIGS. 7, 8, in the case of Comparative Example No. 2, the film itself has bad conductivity, and nitride oxide deposits on the non-erosion areas on the MoSi target during film formation, so that discharge becomes unstable. Accordingly, such a film suffers bad controllability of the transmission rate and film thickness and sometimes defects or the likes in the film. In contrast, the cases of Embodiments 2 to 7, the film itself has good conductivity, and discharge stays stable during film formation. Therefore, the film has good controllability of the transmission rate and film thickness and was free from defects in the film. Since rendering phase shift patterns conducting well, the film prevents the pattern from damaging due to static built-up during use of the mask.

If the containing rate of molybdenum (Mo) in the film is less than 8 atomic per cent (or if the ratio of metal to silicon in the target by atomic per cent is 1 to 19.0 or more), discharges become unstable because the surface of the target (erosion areas) becomes less conducting (or hard to feed voltage).

Acid Resistance

Figure 9:
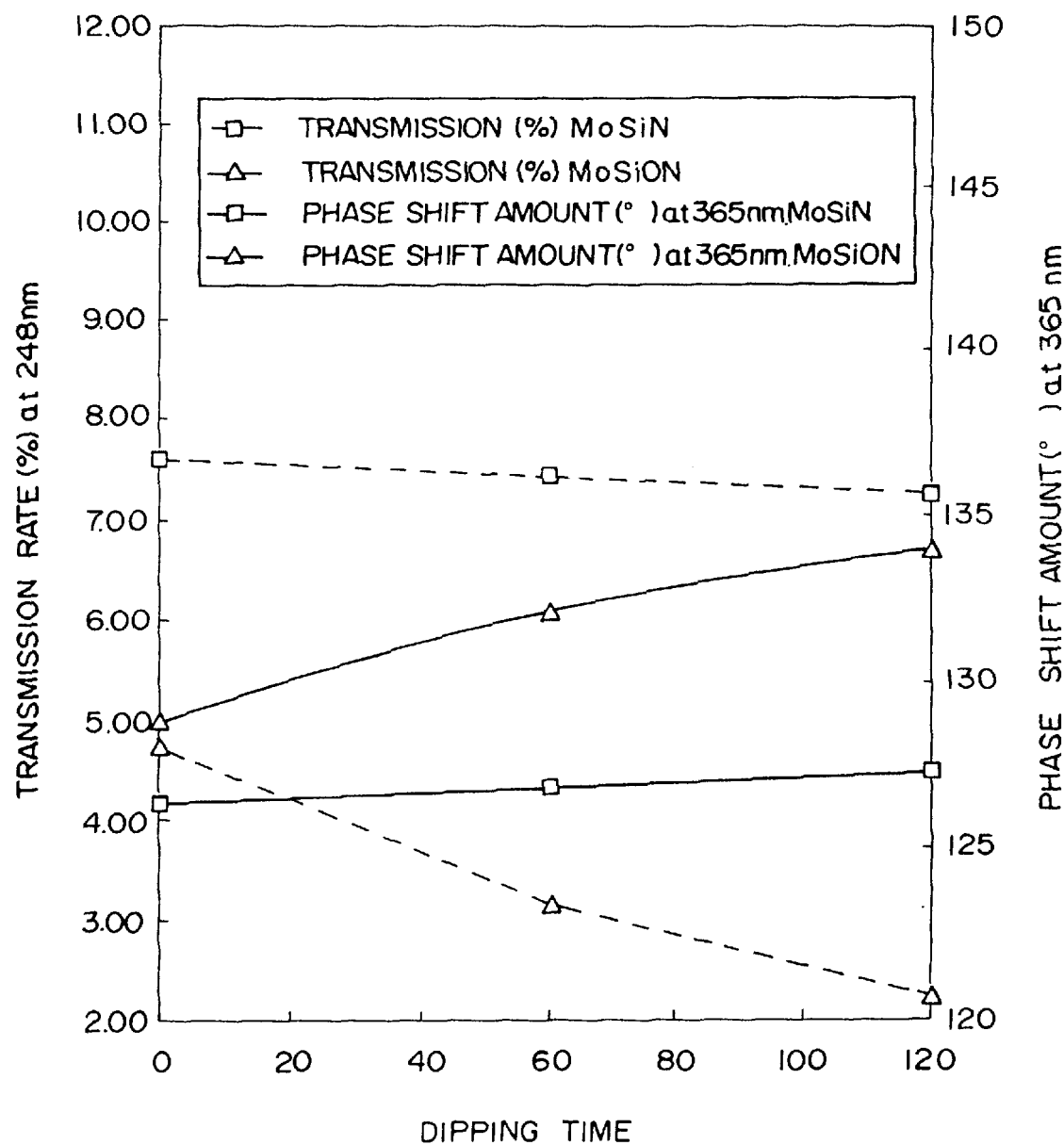
FIG. 9 is a diagram showing acid resistance of a phase shift mask blank according to the present invention.

Acid resistance was examined by dipping blanks of molybdenum silicon nitride (MoSiN), according to the present invention, and of molybdenum silicon nitride oxide (MoSiON) in 96% sulfuric acid ($H_2SO_4$) of 100 Celsius degrees. The results are shown in FIG. 9. FIG. 9 shows changes of light transmission rate of the film at a wavelength of 248 nanometers and changes of phase shift amount of the film at a wavelength of 365 nanometers, against dipping time of the blanks in sulfuric acid.

As apparent from FIG. 9, where the film was dipped in the sulfuric acid of 100 Celsius degrees for 120 minutes, the change amounts of the light transmission rate and phase shift amount of the molybdenum silicon nitride (MoSiN) according to the present invention was only about one eighth of the transmission rate and about one sixth of the phase shift amount, with respect to the change amount of the light transmission rate and phase shift amount of the molybdenum silicon nitride oxide (MoSiON) of the Comparative Examples.

Figure 10:
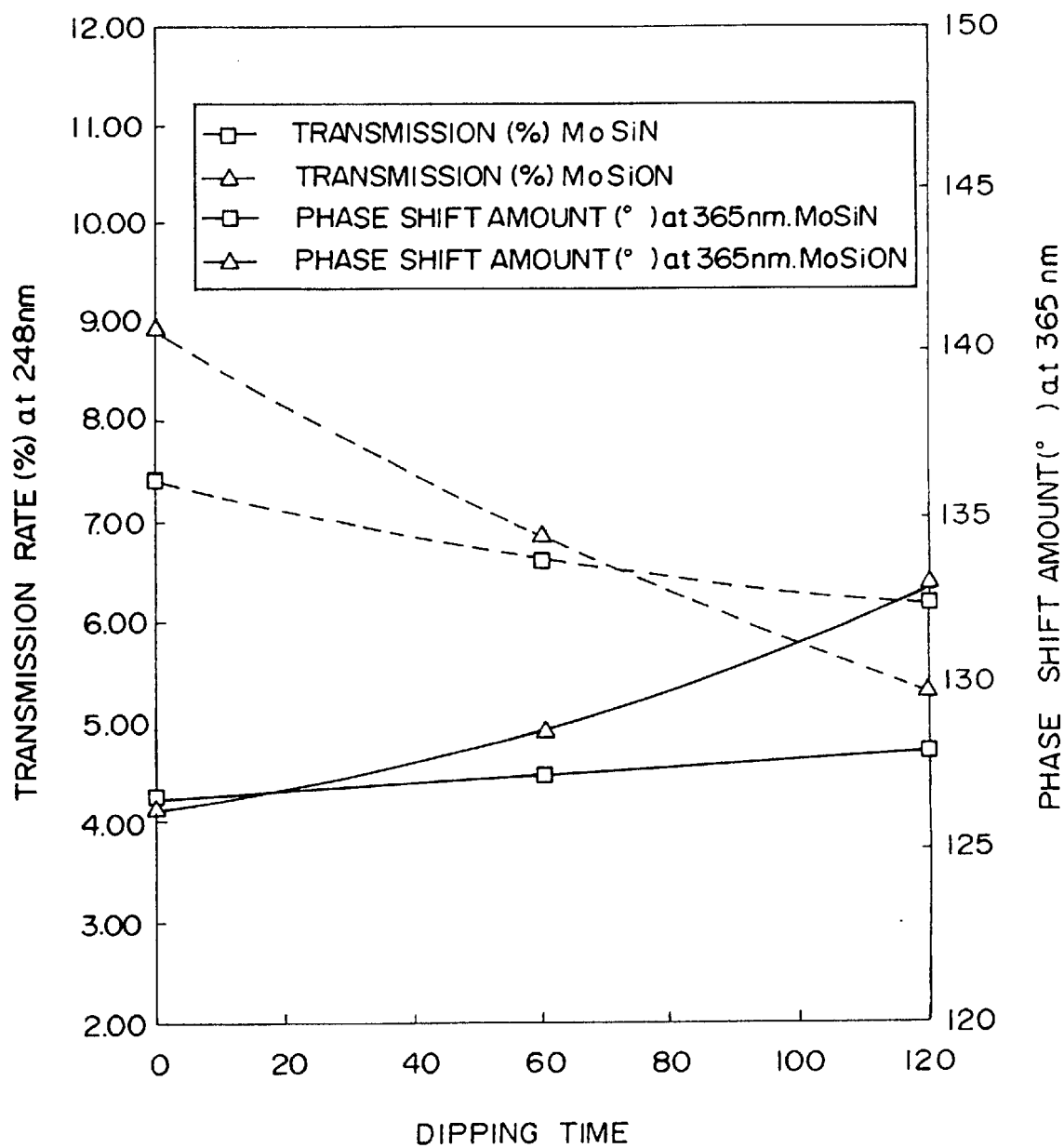
FIG. 10 is a diagram showing durability against alkali of the phase shift mask blank according to the present invention.

Then, the sulfuric acid ($H_2SO_4$) of 100 Celsius degrees was replaced with 2% ammonia solution of 20 Celsius degrees, and alkali resistance was examined in the same manner as above. The results are shown in FIG. 10. FIG. 10 shows changes of light transmission rate of the film at a wavelength of 248 nanometers and changes of phase shift amount of the film at a wavelength of 365 nanometers, against dipping time of the Embodiment and Comparative Example blanks in the ammonia solution. As apparent from FIG. 10, where the film was dipped in the ammonia solution of 20 Celsius degrees for 120 minutes, the change amounts of the light transmission rate and phase shift amount of the molybdenum silicon nitride (MoSiN) according to the present invention was only about one fifth of the transmission rate and about one third of the phase shift amount, with respect to the change amount of the light transmission rate and phase shift amount of the molybdenum silicon nitride oxide (MoSiON) of the Comparative Examples. Consequently, the phase shift mask blank according to the present invention has an excellent property of alkali resistance.

In sum, the acid resistance examination for Embodiments No. 2 to 7 and Comparative Example 2 indicated, as shown in FIGS. 7, 8, the following. The optical characteristics of the light transmission rate and phase shift amount (phase difference) of the phase shift mask obtained in Embodiments No. 2 to 7 deviated less from the set values where the optical characteristics hardly changed due to sulfuric acid rinsing during mask fabrications, and each embodiment had excellent acid resistance. On the other hand, the optical characteristics of the photo transmission rate and phase shift amount (phase difference) of the phase shift mask obtained in Comparative Example 2 deviated greater from the set values where the optical characteristics so changed due to sulfuric acid rinsing during mask fabrications, and Comparative Example No. 2 had a limited acid resistance. The light transmission rate of each phase shift mask obtained in Embodiments No. 2 to 7 is 2 or above, was a high value.

Photo resistance

The photo resistance of the blanks of the molybdenum silicon nitride according to the invention was evaluated. To examine this, changes of the present light transmission rate (at a wavelength of 248 nanometers), phase shift amount (at a wavelength of 365 nanometers), and thickness were checked where a KrF excimer laser beam (wavelength of 248 nanometers) of 200 Hz, 3.09 mJ/cm$^2$, was so radiated onto MoSiN blanks that the accumulated radiation energy reached 53.3 kJ/cm$^2$. The results are shown in FIG. 11. The KrF excimer laser, was a LPX-200cc made by Lambda Physics Corp.

As apparent from FIG. 11, the MoSiN blanks according to the present invention showed very slight changes of the transmission rate 0.21%, the phase shift amount −0.43 degree, and the thickness 1 nanometer, and appeared to have an excellent photo resistance.

As described above, the phase shift mask according to the present invention has an excellent light translucent portion in terms of film characteristics such as acid resistance, photo resistance, conductivity, refractive index rate (film thickness), light transmission rate, etching selectivity, etc. by rendering the light translucent portion constituted of the thin film made of a material essentially including nitrogen, metal, and silicon and by specifying the containing rate (atomic per cent) and ratio of each element in the thin film, thereby satisfying the optical characteristics (i.e., photo transmission rate and phase shift amount) with high precision, as well as reducing defects.

The phase shift mask blank according to the present invention satisfies the optical characteristics with high precision because of having the optimum film characteristics in consideration of present manufacturing process and the like. The phase shift mask blank also allows phase shift masks having less defective light translucent portions to be inexpensively and readily produced with high yield. With the manufacturing method for the phase shift mask blank according to the invention, phase shift mask blanks with the light translucent portion having excellent film characteristics can be produced in a stable manner with no defect upon specifying the composition of the target.

It is to be noted that although in the preferred embodiment, DC sputtering was used, RF sputtering can be used to form the thin film of the light translucent portion, though the DC sputtering is more effective. The thin film of the light translucent portion may be formed by sputtering using target including metal, silicon, nitrogen rather than by reactive sputtering, though reactive sputtering will produce less particles since discharge is relatively stable. Other inactive gases such as helium, neon, xenon, etc. can be used for formation of thin films. Moreover, as a metal, Ta, W, Ti, Cr or the like can be used in lieu of Mo.

The foregoing description of preferred embodiments of the present invention has been presented for purposes of illustration and description, and is not intended to be exhaustive or to limit the present invention to the precise form disclosed. The description was selected to best explain the principles of the present invention and their practical application to enable others skilled in the art to best utilize the present invention in various embodiments and various modifications as are suited to the particular use contemplated. It is intended that the scope of the present invention not be limited by specification, but the be defined in claims set forth below.

What is claimed is:

1. A phase shift mask for exposure of a very fine pattern, comprising:
   a transparent substrate transparent to an exposure light beam; and
   a mask pattern formed on the transparent substrate, wherein said mask pattern comprises:
      a light transmitting portion for permitting the exposure light beam to pass therethrough, said light having an intensity capable of substantially contributing to the exposure; and
      a light translucent portion with a boundary between the light transmitting portion and the light translucent portion,
      the exposure light beam being cancelled in phase in an area adjacent to the boundary between the light transmitting portion and the light translucent portion when the exposure light beam passes through the light transmitting portion and the light translucent portion,
      said light translucent portion being formed of a thin film which consists essentially of nitrogen, metal and silicon, wherein said thin film comprises 34 to 60 atomic % of silicon therein.

2. A phase shift mask according to claim 1, wherein said thin film has a metal to silicon atomic ratio in a range between 1.5 and 6.0.

3. The phase shift mask according to claim 1, wherein said thin film includes 30 to 60 atomic % of nitrogen therein and a nitrogen to silicon atomic ratio of more than one.

4. A phase shift mask blank utilized for a phase shift mask set forth in claim 1.

5. A phase shift mask for exposure of a very fine pattern, comprising:
   a transparent substrate transparent to an exposure light beam; and
   a mask pattern formed on the transparent substrate, wherein said mask pattern comprises:
      a light transmitting portion for permitting the exposure light beam to pass therethrough, said light having an intensity to substantially contributing to the exposure; and
      a light translucent portion with a boundary between the light transmitting portion and the light translucent portion,
      the exposure light beam being canceled in phase in an area adjacent to the boundary between the light transmitting portion and the light translucent portion when the exposure light beam passes through the light transmitting portion and the light translucent portion,
      said light translucent portion being formed of a thin film which consists essentially of nitrogen, a metal selected from the group consisting of molybdenum and titanium, and silicon, wherein said thin film comprises 30 to 60 atomic % of silicon therein.

6. The phase shift mask according to claim 5, wherein said thin film has a metal to silicon atomic ratio in a range between 1.5 and 6.0.

7. The phase shift mask according to claim 5, wherein said thin film includes 30 to 60 atomic % of nitrogen therein and a nitrogen to silicon atomic ratio of more than one.

8. A phase shift mask blank utilized for a phase shift mask set forth in claim 5.

9. A phase shift mask for exposure of a very fine pattern, comprising:
   a transparent substrate transparent to an exposure light beam; and
   a mask pattern formed on the transparent substrate, wherein said mask pattern comprises:
      a light transmitting portion for permitting the exposure light beam to pass therethrough, said light having an intensity capable of substantially contributing to the exposure; and
      a light translucent portion with a boundary between the light transmitting portion and the light translucent portion,
      the exposure light beam being canceled in phase in an area adjacent to the boundary between the light transmitting portion and the light translucent portion when the exposure light beam passes through the light transmitting portion and the light translucent portion,
      said light translucent portion being formed of a thin film which consists essentially of nitrogen, a metal selected from the group consisting of molybdenum and titanium, and silicon, wherein said thin film has a range between 1 K$\Omega$/□ and 1.5 M$\Omega$/□ in sheet resistance.

10. The phase shift mask according to claim 9, wherein said thin film has a metal to silicon atomic ratio is in a range between 1.5 and 6.0.

11. The phase shift mask according to claim 9, wherein said thin film comprises 30 to 60 atomic % of silicon and 30 to 60 atomic % of nitrogen therein, and a nitrogen to silicon atomic ratio of more than one.

12. A phase shift mask blank utilized for a phase shift mask set forth in claim 9.

13. A phase shift mask for exposure of a very fine pattern, comprising:
   a transparent substrate transparent to an exposure light beam; and
   a mask pattern formed on the transparent substrate, wherein said mask pattern comprises:
      a light transmitting portion for permitting the exposure light beam to pass therethrough, said light having an intensity capable of substantially contributing to the exposure; and
      a light translucent portion with a boundary between the light transmitting portion and the light translucent portion,
      the exposure light beam being canceled in phase in an area adjacent to the boundary between the light transmitting portion and the light translucent portion when the exposure light beam passes through the light transmitting portion and the light translucent portion,
      said light translucent portion being formed of a thin film which consists essentially of nitrogen, a metal selected from the group consisting of molybdenum or titanium, and silicon, wherein said thin film comprises 30 to 60 atomic % of nitrogen therein.

14. The phase shift mask according to claim 13, wherein said thin film has a metal to silicon atomic ratio is in a range between 1.5 and 6.0.

15. The phase shift mask according to claim 13, wherein said thin film includes 30 to 60 atomic % of silicon therein and a nitrogen to silicon atomic ratio of more than one.

16. A phase shift mask blank utilized for a phase shift mask set forth in claim 13.

17. A method for manufacturing a phase shift mask blank comprising steps of:
preparing a substrate, transparent to an exposure light beam, and a target containing silicon, in a range between 70 and 95 mol %, and metal therein;
locating the substrate and the target within an atmosphere containing nitrogen; and
sputtering the target to deposit onto the substrate a translucent phase shift film which comprises the metal, the nitrogen and the silicon.

18. The method according to claim 17, wherein the metal is at least one element selected from a group consisting of molybdenum, titanium, tantalum, tungsten and chromium.

19. A method for manufacturing a phase shift mask blank comprising steps of:
preparing a substrate, transparent to an exposure light beam, and a target containing silicon and metal therein, wherein a mol % ratio of metal to silicon is higher than a stoichiometrically stable composition ratio of 33 relative to 67;
locating the substrate and the target within an atmosphere containing nitrogen; and
sputtering the target to deposit onto the substrate a translucent phase shift film which comprises the metal, the nitrogen and the silicon.

20. A phase shift mask for exposure of a very fine pattern, comprising:
a transparent substrate transparent to an exposure light beam; and
a mask pattern formed on the transparent substrate, wherein said mask pattern comprises:
a light transmitting portion for permitting the exposure light beam to pass therethrough, said light having an intensity capable of substantially contributing to the exposure; and
a light translucent portion with a boundary between the light transmitting portion and the light translucent portion,
the exposure light beam being canceled in phase in an area adjacent to the boundary between the light transmitting portion and the light translucent portion when the exposure light beam passes through the light transmitting portion and the light translucent portion,
said light translucent portion being formed of a thin film which consists of nitrogen, metal and silicon, wherein said thin film comprises 34 to 60 atomic % of silicon therein.

21. A phase shift mask for exposure of a very fine pattern, comprising:
a transparent substrate transparent to an exposure light beam; and
a mask pattern formed on the transparent substrate, wherein said mask pattern comprises:
a light transmitting portion for permitting the exposure light beam to pass therethrough, said light having an intensity capable of substantially contributing to the exposure; and
a light translucent portion with a boundary between the light transmitting portion and the light translucent portion;
the exposure light beam being canceled in phase in an area adjacent to the boundary between the light transmitting portion and the light translucent portion when the exposure light beam passes through the light transmitting portion and the light translucent portion,
said light translucent portion being formed of a thin film which consists of nitrogen, a metal selected from the group consisting of molybdenum and titanium, and silicon, wherein said thin film comprises 30 to 60 atomic % of silicon therein.

22. A phase shift mask for exposure of a very fine pattern, comprising:
a transparent substrate transparent to an exposure light beam; and
a mask pattern formed on the transparent substrate, wherein said mask pattern comprises:
a light transmitting portion for permitting the exposure light beam to pass therethrough, said light having an intensity capable of substantially contributing to the exposure; and
a light translucent portion with a boundary between the light transmitting portion and the light translucent portion,
the exposure light beam being canceled in phase in an area adjacent to the boundary between the light transmitting portion and the light translucent portion when the exposure light beam passes through the light transmitting portion and the light translucent portion,
said light translucent portion being formed of a thin film which consists of nitrogen, a metal selected from the group consisting of molybdenium and titanium, and silicon, wherein said thin film has a range between 1 KΩ/□ and 1.5 MΩ/□ in sheet resistance.

23. A phase shift mask for exposure of a very fine pattern, comprising:
a transparent substrate transparent to an exposure light beam; and
a mask pattern formed on the transparent substrate, wherein said mask pattern comprises:
a light transmitting portion for permitting the exposure light beam to pass therethrough having an intensity substantially contributing to the exposure; and
a light translucent portion with a boundary between the light transmitting portion and the light translucent portion,
the exposure light beam being canceled in phase in an area adjacent to the boundary between the light transmitting portion and the light translucent portion when the exposure light beam passes through the light transmitting portion and the light translucent portion,
said light translucent portion being formed of a thin film which consists of nitrogen, a metal selected from a group consisting of molybdenum and titanium, and silicon, wherein said thin film comprises 30 to 60 at % of nitrogen therein.

24. A method for manufacturing a phase shift mask comprising steps of:
preparing a phase shift mask blank by preparing a substrate, transparent to an exposure light beam, and a target containing silicon, in a range between 70 and 95 mol %, and metal therein; locating the substrate and the target within an atmosphere containing nitrogen; and sputtering the target to deposit onto the substrate a translucent phase shift film which comprises the metal, the nitrogen and the silicon; and forming a pattern on the phase shift mask blank by a photolithography technique.

25. A method of forming a fine pattern comprising steps of:

preparing a substrate, and a phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being cancelled in phase in an area adjacent to the boundary between the light transmitting portion and the light translucent portion when the exposure light beam passes through the light transmitting portion and the light translucent portion, said light translucent portion being formed of a thin film which consists essentially of nitrogen, metal and silicon, wherein said thin film comprises 34 to 60 atomic % of silicon therein; and forming a pattern on the substrate through the phase shift mask by a photolithography technique.

26. A method of forming a fine pattern comprising steps of:

preparing a substrate, and a phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity to substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenum and titanium, and silicon, wherein said thin film comprises 30 to 60 atomic % of silicon therein; and forming a pattern on the substrate through the phase shift mask by a photolithography technique.

27. A method of forming a fine pattern comprising steps of:

preparing a substrate, and a phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenium and titanium, and silicon, wherein said thin film has a range between 1 K$\Omega$/□ and 1.5 M$\Omega$/□ in sheet resistance; and forming a pattern on the substrate through the phase shift mask by a photolithography technique.

28. A method of forming a fine pattern comprising steps of:

preparing a substrate, and a phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenum or titanium, and silicon, wherein said thin film comprises 30 to 60 atomic % of nitrogen therein; and forming a pattern on the substrate through the phase shift mask by a photolithography technique.

29. A method of manufacturing a semiconductor device comprising steps of:

preparing a substrate, and phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being cancelled in phase in an area adjacent to the boundary between the light transmitting portion and the light translucent portion when the exposure light beam passes through the light transmitting portion and the light translucent portion, said light translucent portion being formed of a thin film which consists essentially of nitrogen, metal and silicon, wherein said thin film comprises 34 to 60 atomic % of silicon therein; and forming a pattern of the semiconductor device on the substrate through the phase shift mask by a photolithography technique.

30. A method of manufacturing a semiconductor device comprising steps of:

preparing a substrate, and phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity to substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenum and titanium, and silicon, wherein said thin film comprises 30 to 60 atomic % of silicon therein; and forming a pattern of the semiconductor device on the substrate through the phase shift mask by a photolithography technique.

31. A method of manufacturing a semiconductor device comprising steps of:

preparing a substrate, and phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenium and titanium, and silicon, wherein said thin film has a range between 1 K$\Omega$/□ and 1.5 M$\Omega$/□ in sheet resistance; and forming a pattern of the semiconductor device on the substrate through the phase shift mask by a photolithography technique.

32. A method of manufacturing a semiconductor device comprising steps of:

preparing a substrate, and phase shift mask, wherein said phase shift mask comprises a transparent substrate transparent to an exposure light beam; and a mask pattern formed on the transparent substrate, wherein said mask pattern comprises a light transmitting portion for permitting the exposure light beam to pass therethrough, said light having an intensity capable of substantially contributing to the exposure; and a light translucent portion with a boundary between the light transmitting portion and the light translucent portion, the exposure light beam being canceled in phase in an area adjacent to the boundary between the light transmitting portion and the light translucent portion when the exposure light beam passes through the light transmitting portion and the light translucent portion, said light translucent portion being formed of a thin film which consists essentially of nitrogen, a metal selected from the group consisting of molybdenum or titanium, and silicon, wherein said thin film comprises 30 to 60 atomic % of nitrogen therein; and forming a pattern of the semiconductor device on the substrate through the phase shift mask by a photolithography technique.

* * * * *